(12) United States Patent
Bao (10) Patent No.: US 9,570,468 B2
(45) Date of Patent: Feb. 14, 2017

(54) SEMICONDUCTOR DEVICE WITH THREE OR FOUR-TERMINAL-FINFET

(71) Applicant: Semiconductor Manufacturing International (Shanghai) Corporation, Shanghai (CN)

(72) Inventor: Wayne Bao, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/013,840

(22) Filed: Feb. 2, 2016

(65) Prior Publication Data

US 2016/0155758 A1  Jun. 2, 2016

Related U.S. Application Data

(62) Division of application No. 14/060,881, filed on Oct. 23, 2013, now Pat. No. 9,287,182.

(30) Foreign Application Priority Data

Dec. 18, 2012 (CN) .......................... 2012 1 0553317

(51) Int. Cl.
*H01L 21/84* (2006.01)
*H01L 27/12* (2006.01)
*H01L 29/66* (2006.01)
*H01L 21/28* (2006.01)
*H01L 21/8234* (2006.01)
*H01L 29/10* (2006.01)
*H01L 29/423* (2006.01)
*H01L 29/78* (2006.01)

(52) U.S. Cl.
CPC ..... *H01L 27/1211* (2013.01); *H01L 21/28123* (2013.01); *H01L 21/823412* (2013.01); *H01L 21/823456* (2013.01); *H01L 21/845* (2013.01); *H01L 29/1037* (2013.01); *H01L 29/4238* (2013.01); *H01L 29/66795* (2013.01); *H01L 29/785* (2013.01); *H01L 29/7855* (2013.01)

(58) Field of Classification Search
CPC ................ H01L 21/845; H01L 27/1211; H01L 29/66795
See application file for complete search history.

(56) References Cited

U.S. PATENT DOCUMENTS

| 5,629,224 A | 5/1997 | Rostoker et al. |
| 8,803,241 B2 | 8/2014 | Lin et al. |
| 2007/0259501 A1 | 11/2007 | Xiong et al. |
| 2010/0118599 A1 | 5/2010 | Marshall et al. |

*Primary Examiner* — Thanh V Pham
(74) *Attorney, Agent, or Firm* — Anova Law Group, PLLC (57) ABSTRACT

Semiconductor devices and fabrication methods for simultaneously forming a 3T-FinFET and a 4T-FinFET on a same substrate are provided. A first fin and a second fin can be formed on a semiconductor substrate. The first fin has a top surface higher than the second fin. A first gate dielectric layer and a first gate can be formed across the first fin. A second gate dielectric layer and a second gate can be formed across the second fin. An interlayer dielectric layer can be formed to cover the first gate, the second gate, and the semiconductor substrate. A first portion of the interlayer dielectric layer, a portion of the first gate, and a portion of the first gate dielectric layer, over the first fin, and a second portion of the interlayer dielectric layer over the second fin can be removed to expose the second gate.

6 Claims, 12 Drawing Sheets

FIG. 1

(*Prior art*)

FIG. 2

(*Prior art*)

SEMICONDUCTOR DEVICE WITH THREE OR FOUR-TERMINAL-FINFET

CROSS REFERENCE TO RELATED APPLICATIONS

This application is a divisional of U.S. patent application Ser. No. 14/060,881, filed on Oct. 23, 2013, which claims priority to Chinese Patent Application CN201210553317.9, filed on Dec. 18, 2012, the entire contents of all of which are incorporated herein by reference.

FIELD OF THE DISCLOSURE

The present disclosure relates to the field of semiconductor technology and, more particularly, relates to a semiconductor device including a 3T-FinFET and a 4T-FinFET and fabrication methods.

BACKGROUND

In the area of semiconductor technologies, the degree of integration of integrated circuit (ICs) becomes increasingly high with the advancing of large scale IC to ultra large scale IC. However, the static power consumption of an IC increases as a result of transistor short-channel effects due to the high degree of IC integration. Generally, static power consumption refers to power consumption required by a stable circuit, which includes power consumption at work conditions and in a standby mode. For a normal functioning transistor, the threshold voltage is fixed. When the transistor functions steadily, the current between source/drain is $I_{on}$. When the gate voltage cannot reach the threshold voltage, the current between source/drain is $I_{off}$, and the transistor is in a standby mode. It is desirable to reduce the power consumption of the transistor in the standby mode to reduce the static power consumption of the transistor.

Conventional solutions to reduce static power consumption include modulating transistor threshold voltage using DG-FinFET (i.e., double gate-FinFET).

Figure 1:
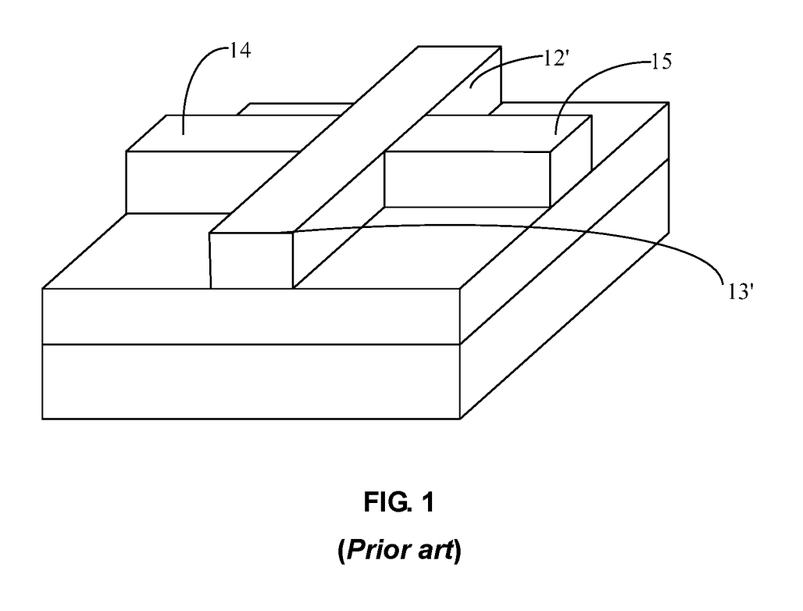
FIG. 1 depicts a conventional 4T-FinFET.

DG-FinFET is also known as four-terminal-FinFET or 4T-FinFET. FIG. 1 depicts a 4T-FinFET including 4 terminals a source end 12', a drain end 13', a first gate 14, and a second gate 15 on the sides of the fin. The first gate 14 and the second gate 15 are also respectively referred to as a drive gate and a control gate, each independently controlled by a voltage. The drive gate can be used to turn on or off devices while the control gate can be used to modulate the threshold voltage (Vt) of a transistor. Specifically, if the transistor is to be turned on, the control gate is used to reduce the threshold voltage, which leads the voltage of the drive gate to reach the threshold voltage to turn on the transistor. To put the transistor in a standby mode, the control gate is used to increase the threshold voltage, which leads the voltage of the drive gate not to meet the threshold voltage to switch the transistor in to the standby mode. When in a standby mode, as the threshold voltage increases, $I_{off}$ reduces. The power consumption in the standby mode decreases. Therefore, the static power consumption of the transistor can be reduced by controlling the control gate to increase the threshold voltage in the standby mode.

Figure 2:
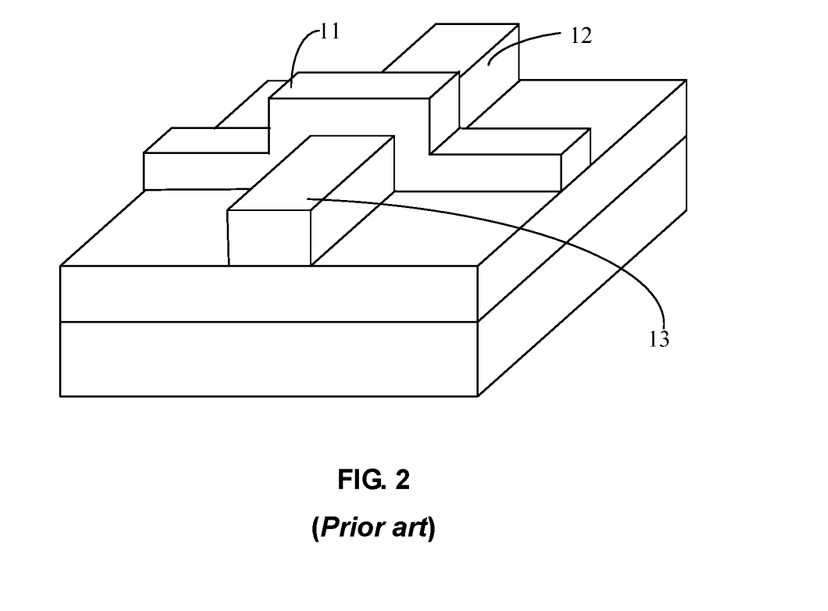
FIG. 2 depicts a conventional 3T-FinFET.

FIG. 2 shows a conventional three-terminal FinFET (3T-FinFET) including three terminals: a source end 12, a drain end 13, and a gate 11. The gate 11 is formed across a fin (not shown). The 4T-FinFET shown in FIG. 1 may be obtained through chemical mechanical polishing of the convex part of the upper gate of the fin of the 3T-FinFET. However, it is difficult to simultaneously produce a 3T-FinFET and a 4T-FinFET on a same wafer.

BRIEF SUMMARY OF THE DISCLOSURE

One aspect of present disclosure includes a method for forming a semiconductor device. A first fin and a second fin can be formed on a semiconductor substrate. The first fin has a top surface higher than the second fin from the semiconductor substrate. A first gate dielectric layer can be formed across the first fin, a first gate can be formed on the first gate dielectric layer, a second gate dielectric layer can be formed across the second fin, and a second gate can be formed on the second gate dielectric layer. An interlayer dielectric layer can be formed to cover the first gate, the second gate, and the semiconductor substrate. A first portion of the interlayer dielectric layer, a portion of the first gate, and a portion of the first gate dielectric layer over the top surface of the first fin and a second portion of the interlayer dielectric layer over the second fin can be removed to expose the second gate over the second fin. The second gate remains intact while removing, according to a height difference between the first fin and the second fin.

Another aspect of present disclosure includes a semiconductor device. A first fin and a second fin can be disposed on a semiconductor substrate. The first fin has a top surface higher than the second fin from the semiconductor substrate. A first gate dielectric layer can be disposed on opposite sides of the first fin, a first gate can be on the first gate dielectric layer, a second gate dielectric layer can be disposed across the second fin, and a second gate can be on the second gate dielectric layer. An interlayer dielectric layer can be disposed over the semiconductor substrate. The interlayer dielectric layer has a top surface leveled with the top surface of the first fin and a top surface of the second gate.

Another aspect of present disclosure includes a method for forming a semiconductor device. A first fin, a first mask layer on the first fin, and a second fin can be formed on the semiconductor substrate. The first fin has a top surface leveled with the second fin. A first gate dielectric layer, a first gate, a second gate dielectric layer, and a second gate can be formed. The first gate and the first gate dielectric layer are formed across the first mask layer and the first fin, and the second gate and the second gate dielectric layer are formed across the second fin. An interlayer dielectric layer can be formed to cover the semiconductor substrate, the first gate, and the second gate. A first portion of the interlayer dielectric layer, a portion of the first gate, and a portion of the first gate dielectric layer over the first fin and a second portion of the interlayer dielectric layer over the second fin can be removed to expose the second gate over the second fin. The second gate remains intact while removing.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. For illustration purposes, the schematic drawings may be not to scale. The schematic drawings are solely illustrative, and should not limit the scope of the present disclosure. In addition, three-dimensional scales of length, width and depth should be included in practical fabrication process.

Semiconductor devices and fabrication methods are disclosed herein. An exemplary semiconductor device can include a 3T-FinFET and a 4T-FinFET that are simultaneously formed on a semiconductor substrate.

Figure 3:
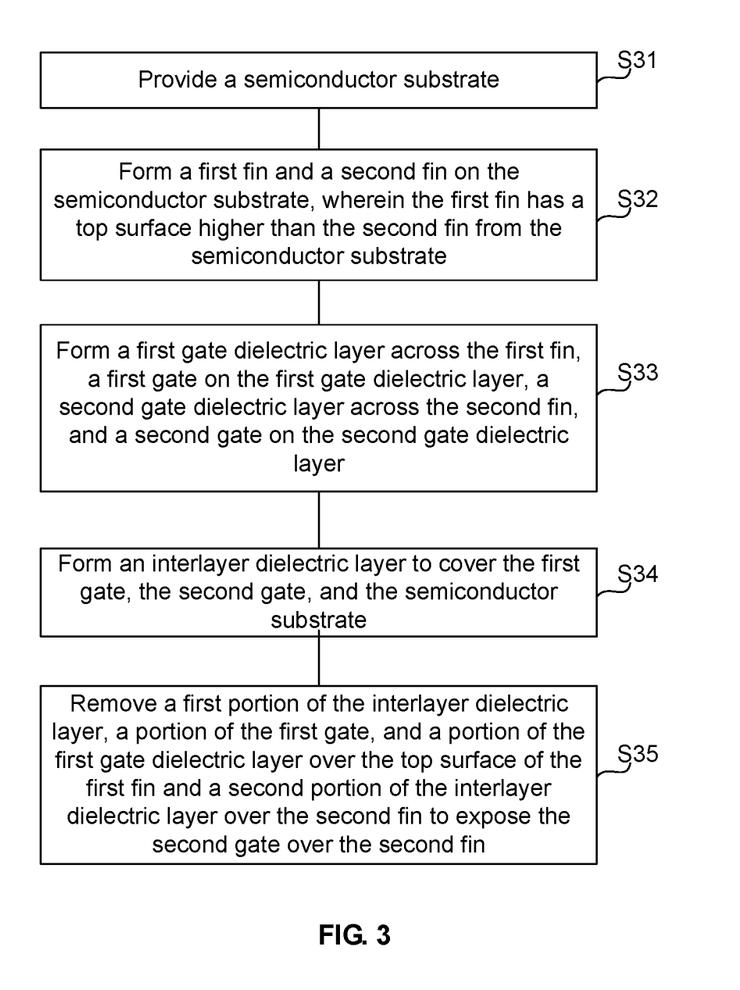
FIG. 3 depicts an exemplary method for forming a semiconductor device in accordance with various disclosed embodiments.

FIG. 3 depicts an exemplary method for forming a semiconductor device, while FIGS. 4-10 depict corresponding semiconductor device at various stages during its formation in accordance with various disclosed embodiments.

Figure 4:
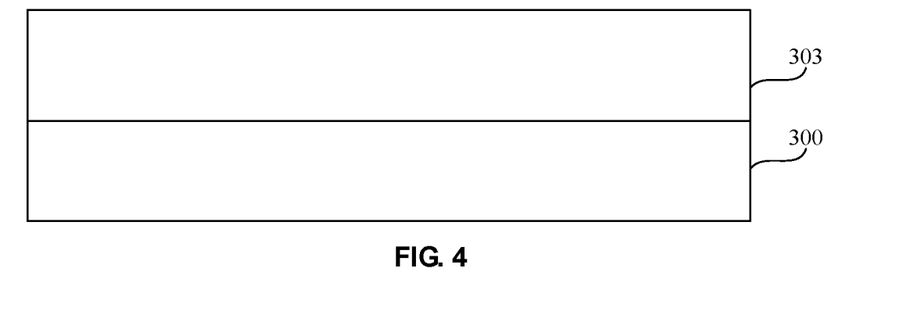
FIGS. 4-10 are cross-sectional views of an exemplary semiconductor device at various stages during its formation in accordance with various disclosed embodiments.

In Step S31 of FIG. 3 and referring to FIG. 4, a semiconductor substrate 300 is provided for subsequently forming a 3T-FinFET and 4T-FinFET on the semiconductor substrate.

The semiconductor substrate includes an SOI (silicon-on-insulator) substrate. The SOI substrate includes a top silicon layer 303, a bottom silicon layer 300, and an insulating layer sandwiched between the top silicon layer 303 and the bottom silicon layer 300. As shown in FIG. 4, the top silicon layer 303 is used to form a fin of the transistor. The insulating layer provides electrical insulation between the semiconductor devices.

Figure 7:
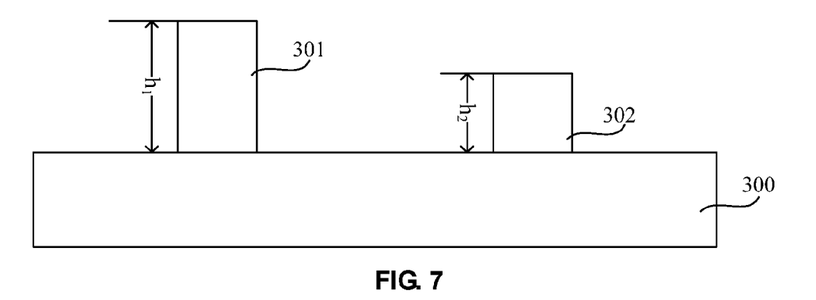

In Step S32 of FIG. 3 and referring to FIG. 7, a first fin 301 and a second fin 302 are formed on the semiconductor substrate 300. A top surface of the first fin 301 is higher than a top surface of the second fin 302. A height $h_1$ of the top surface of the first fin 301 from the top surface of the semiconductor substrate 300 is greater than a height $h_2$ of the top surface of the second fin 302 from the top surface of the semiconductor substrate 300. More specifically, the height $h_1$ of the top surface of the first fin 301 from the top surface of the semiconductor substrate 300 requires for a certain level such that the second gate is not removed when subsequently removing the first gate dielectric layer and the first gate of the first fin 301.

A height difference $\Delta h$ (i.e., h1-h2) between the top surface of the first fin 301 and the top surface of the second fin 302 from the top surface of the semiconductor substrate 300 is greater or equal to a combined thickness of a second gate and a second gate dielectric layer to be subsequently formed. This is based on the following considerations. When the height difference $\Delta h$ (i.e., h1-h2) is smaller than the combined thickness of the second gate and the second gate dielectric layer to be formed subsequently, a part or a whole of the second gate, and/or the second gate dielectric layer, may be removed at the time when a first gate dielectric layer formed on the first fin 301, the first gate on the first fin 301, and an interlayer dielectric layer formed on the first fin 301 are removed subsequently. This affects performance of the formed semiconductor device and is not desirable. Although in some cases the performance of semiconductor devices are not severely compromised, the height difference $\Delta h$ (i.e., h1-h2) may be smaller than the combined thickness of the second gate and the second gate dielectric layer to be formed subsequently.

When the height difference $\Delta h$ (i.e., h1-h2) is greater than the combined thickness of the second gate and the second gate dielectric layer to be formed subsequently, in the case when the first gate dielectric layer, the first gate, and the inter-layer dielectric layer of the first fin 301 are subsequently removed, some part of the inter-layer dielectric layer of the second gate is not entirely removed and the second gate has some inter-layer dielectric layer so that the entire second gate can remain intact.

When the height difference $\Delta h$ (i.e., h1-h2) equals to the combined thickness of the second gate and the second gate dielectric layer to be subsequently formed, then the second gate remains when the entire inter-layer dielectric layer of the second gate is completely removed. Therefore, the height difference $\Delta h$ (i.e., h1-h2) between the top surface of the first fin 301 and the top surface of the second fin 302 should ideally be greater or equal to the combined thickness of the second gate formed subsequently and the second gate dielectric layer.

Figure 5:
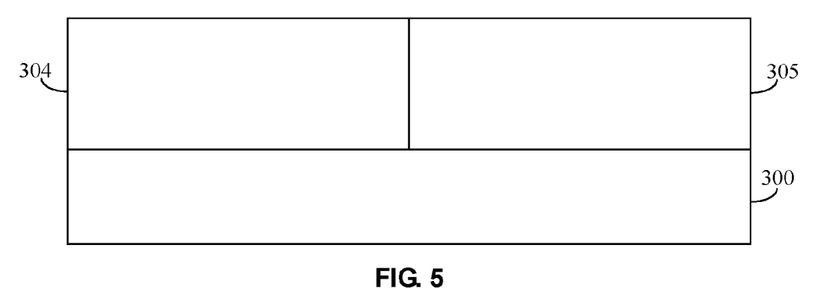
Figure 6:
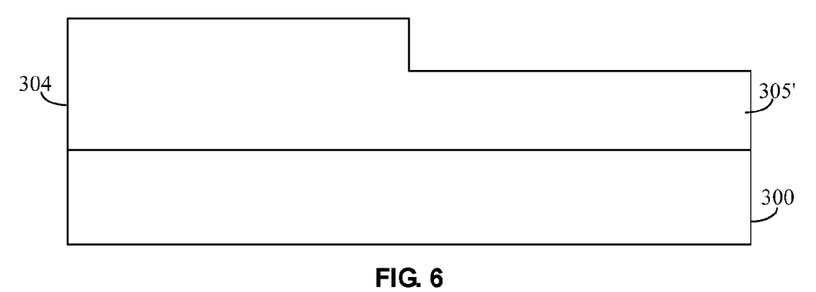

FIGS. 5-6 depict an exemplary method for forming the first fin 301 and second fin 302 on the semiconductor substrate 300.

In FIG. 5, the top silicon layer 303 is divided into two parts including a first top silicon layer 304 and a second top silicon layer 305. The first top silicon layer 304 is used to form the first fin, while the second top silicon layer 305 is used to form the second fin.

In FIG. 6, the second top silicon layer 305 is partially removed to form a second top silicon layer 305' on the semiconductor substrate 300. For example, a patterned photoresist layer can be formed on the first top silicon layer 304 to define the second top silicon layer 305. The patterned photoresist layer can be used as a mask to etch a portion of the second top silicon layer 305. The patterned photoresist layer can then be removed. The height that is removed from the second top silicon layer 305 defines the height difference $\Delta h$ (i.e., h1-h2) between the top surface of the first fin 301 and the top surface of the second fin 302 which are to be formed.

In FIG. 7, the first top silicon layer 304 and the formed second top silicon layer 305' are patterned to form the first fin 301 and the second fin 302. Patterning the first top silicon layer 304 and the second top silicon layer 305' includes forming a patterned photoresist layer on the first top silicon layer 304 and the second top silicon layer 305' to define positions of the first fin 301 and the second fin 302 to be formed. The patterned photoresist layer is used as a mask to etch the first top silicon layer 304 and the second top silicon layer 305' to form the first fin 301 and the second fin 302. The patterned photoresist layer is then removed.

Figure 8:
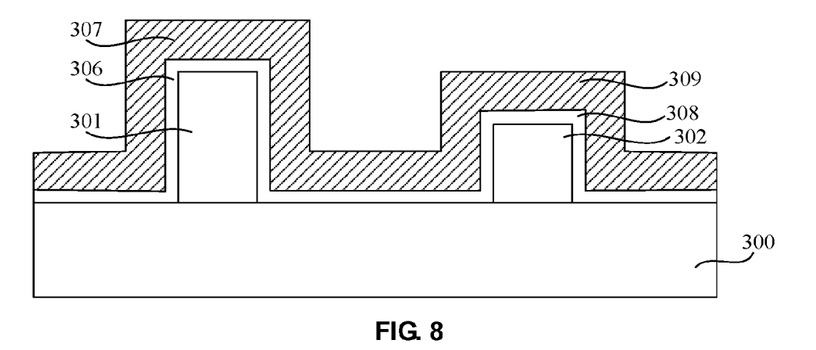

In Step S33 of FIG. 3 and referring to FIG. 8, the first gate dielectric layer 306 is formed across the first fin 301 and the first gate 307 is formed on the first gate dielectric layer 306. The second gate dielectric layer 308 is formed across the second fin 302, and the second gate 309 is formed on the second gate dielectric layer 308. Specifically, the first fin under the first gate dielectric layer 306 is referred to as the first channel region while the second fin under the second gate dielectric layer 308 is referred to as the second channel region.

The first gate dielectric layer and the first gate, and the second gate dielectric layer and the second gate can be formed as following. For example, a dielectric layer and a gate layer can be formed on the semiconductor substrate. The dielectric layer and the gate layer are then patterned to form the gate dielectric layer and the gate across the first fin and the second fin. The gate dielectric layer and the gate across the first fin are called the first gate dielectric layer and the first gate, respectively. The gate dielectric layer and the gate across the second fin are referred to as the second gate dielectric layer and the second gate, respectively.

In FIG. 8, the first gate 307 and the second gate 309 are connected. In various embodiments, the first and second gates may or may not be connected depending on the actual needs. For example, when semiconductor devices to be formed requires coordinated functions of two transistors, the first gate 307 and the second gate 309 may be connected. When the two transistors require functions independent from each other, the first gate and second gate may be disconnected after their formation.

Figure 9:
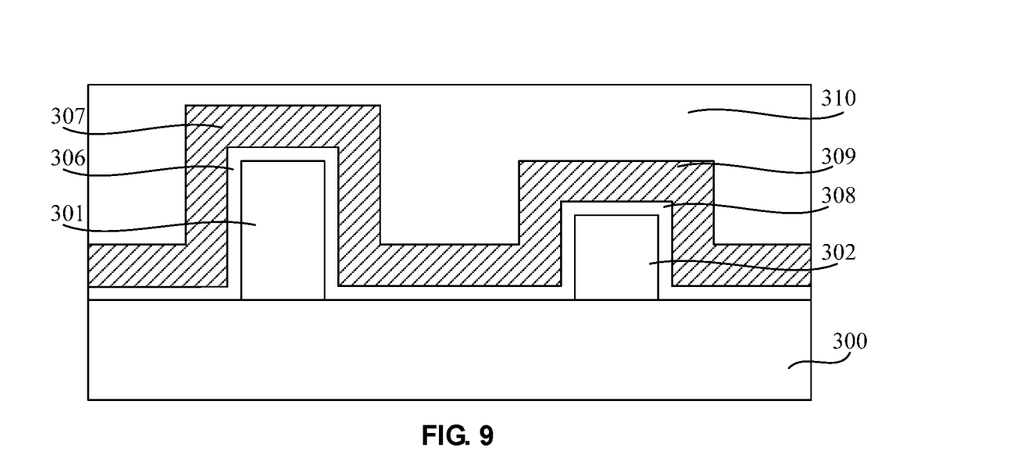

In Step S34 in FIG. 3, and referring to FIG. 9, an inter-layer dielectric layer 310 is formed to cover the entire surface of FIG. 8 including the substrate 300, the first gate 307 and the second gate 309. The inter-layer dielectric layer 310 can be formed by, e.g., chemical vapor deposition.

Figure 10:
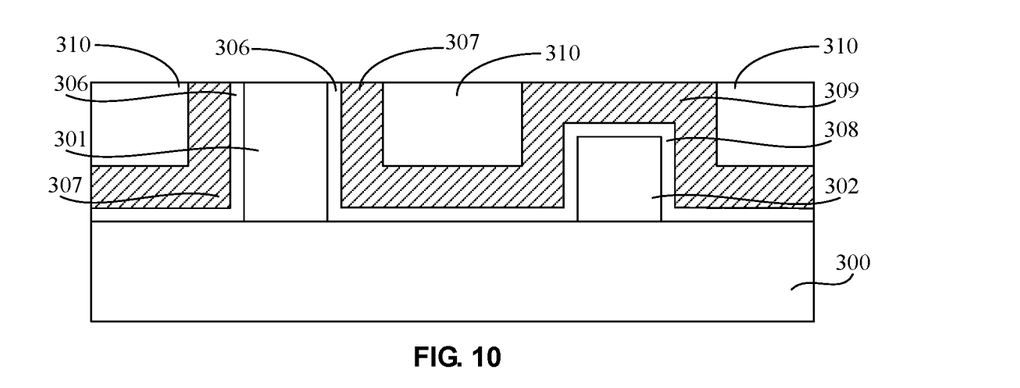

In Step S35 in FIG. 3 and referring to FIG. 10, a portion of the inter-layer dielectric layer 310, a portion of the first gate dielectric layer 306, and a portion of the first gate 307 on the first fin 301, and a portion of the inter-layer dielectric layer 310 on the second gate 309 are removed. That is, portions of the semiconductor structure shown in FIG. 9 that are higher than a top surface of the first fin 301 are removed such that, after removal, a remaining surface of each of: the first gate dielectric layer and the first gate which are on the opposite sides of the first fin 301, and the inter-layer dielectric layer 310 are leveled (flushed) with a top surface of the first fin 301 and a top surface of the second gate 309 on the second fin 302. This removal can be performed by using CVD process or an etching back process.

Step S32 is performed to define and form the first fin 301 and the second fin 302 and to ensure the height difference Δh (i.e., h1-h2) between the top surface of the first fin 301 and the top surface of the second fin 302 is greater or equal to a combined thickness of a second gate and a second gate dielectric layer to be subsequently formed. However, in the case when the height difference Δh (i.e., h1-h2) between the top surface of the first fin 301 and the top surface of the second fin 302 equals to a combined thickness of a second gate and a second gate dielectric layer, portion(s) of the second gate layer are not removed in Step S35 when portions of the first gate dielectric layer and the first gate of the first fin are removed.

To simultaneously form a 3T-FinFET and 4T-FinFET on a same wafer is significant and is a major breakthrough in semiconductor technologies. Various embodiments provide a simple process. When forming a fin, the height difference Δh (i.e., h1-h2) between the top surface of the first fin 301 and the top surface of the second fin 302 is pre-defined and formed, such that, when portions of the first gate dielectric layer and the first gate from the first fin are subsequently removed, the second gate of the second fin is not removed. This simplifies manufacturing process and improves manufacturing efficiency. In addition, the present disclosure combines existing technologies of lithography and etching, providing simple manufacturing process with improved manufacturing efficiency and reduced manufacturing cost.

Referring to FIG. 3 of the exemplary method for forming a semiconductor device, FIGS. 11-15 depict another exemplary corresponding semiconductor device at various stages during its formation in accordance with various disclosed embodiments.

For example, Step S31 of FIG. 1 can be performed as depicted above. In Step S32 of FIG. 3 and referring to FIGS. 11-13, the first fin 301 and the second fin 302 are formed on the semiconductor substrate 300. The top surface of the first fin 301 is higher than the top surface of the second fin 302. The first mask layer 311 is also formed on the first fin 301. More specifically, the height difference Δh (i.e., h1-h2) between the top surface of the first mask layer 311 and the top surface of the second fin 302 is greater than or equal to a combined thickness of the second gate dielectric layer and the second gate that are to be formed.

Referring to the methods used to form the first fin 301 and the second fin 302 as described above, the first mask layer 311 can be formed on the first fin 301 as following.

Figure 11:
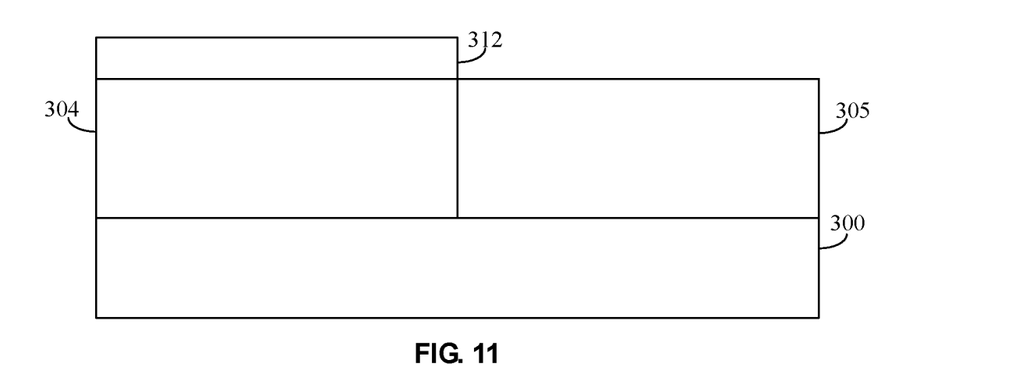
FIGS. 11-15 are cross-sectional views of another exemplary semiconductor device at various stages during its formation in accordance with various disclosed embodiments.

In FIG. 5 and FIG. 11, prior to the removal of a top height of the second top silicon layer 305, a mask layer 312 is formed on the first top silicon layer 304. The mask layer 312 can be formed on the first top silicon layer 304 by depositing a mask material to cover the first top silicon layer 304 and the second top silicon layer 305. The mask material is then patterned such that a part of the mask layer 312 on the first top silicon layer 304 remains.

Figure 12:
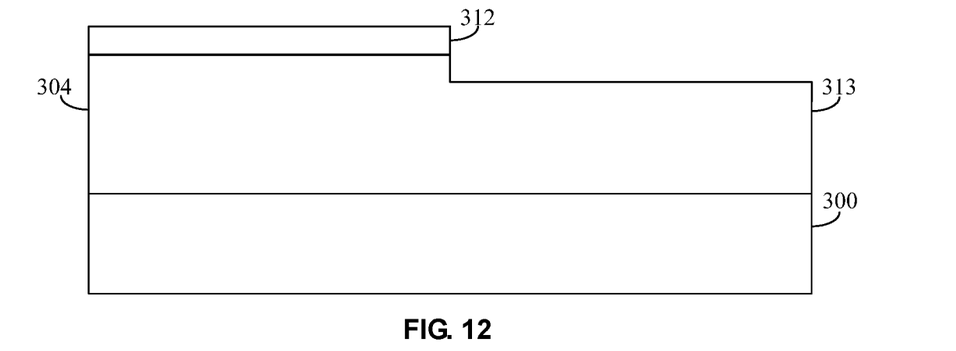
Figure 13:
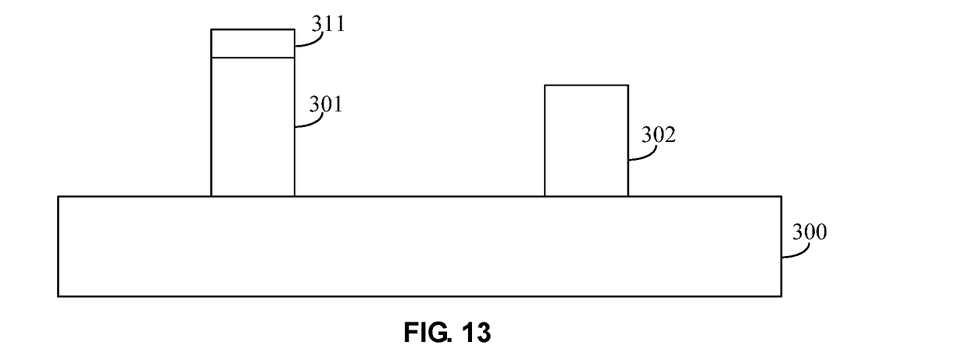

Referring to FIG. 12, the mask layer 312 is used as a mask to partially etch the second top silicon layer 305 to form a remaining portion of the second top silicon layer 305 as a second top silicon layer 313. Referring to FIGS. 12-13, the first top silicon layer 304 and the remaining second top silicon layer 312 can be patterned and etched to form the first fin 301 and the second fin 302. The mask layer 312 is then patterned to form the first mask layer 311 on the first fin 301. Materials used for the first mask layer 311 can be silicon nitride, silicon oxide, silicon nitride oxide, amorphous carbon, and/or boron nitride.

Figure 14:
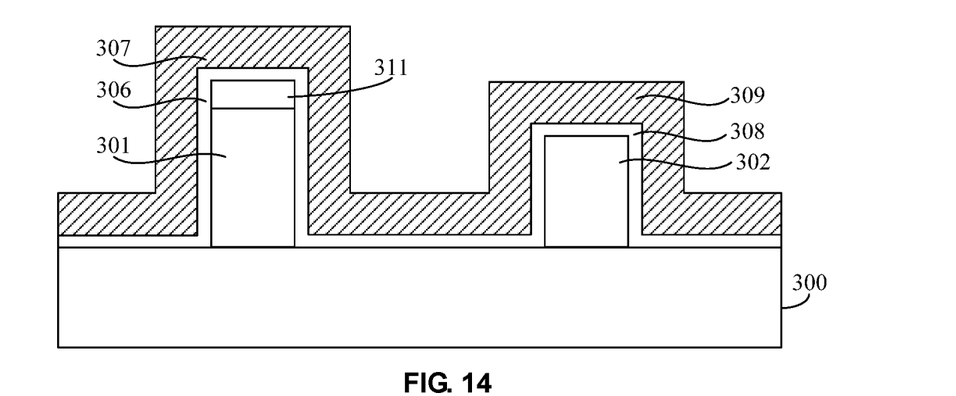

In Step S33 of FIG. 3 and referring to FIG. 14, the first gate dielectric layer 306 and the first gate 307 are formed across the first mask layer 311 (and the first fin 301). The second gate dielectric layer 308 and the second gate 309 are formed across the second fin 302. Methods used to form the first gate dielectric layer 306, the first gate 307, the second gate dielectric layer 308, and the second gate 309 can be formed as depicted above.

The method depicted in FIG. 3 can then proceed to perform Step S34 as depicted above. In Step S35 of FIG. 3 and referring to FIG. 15, a portion of the inter-layer dielectric layer 310, a portion of the first gate dielectric layer 306, and a portion of the first gate 307 on the first mask layer 311, and a portion of the inter-layer dielectric layer 310 on the second gate 309 are removed. That is, portions of the semiconductor structure shown in FIG. 14 that are higher than a top surface of the first mask layer 311 are removed such that, after removal, a remaining surface of each of: the first gate dielectric layer and the first gate which are on the opposite sides of the first mask layer 311 and the first fin 301, and the inter-layer dielectric layer 310 are leveled (flushed) with a top surface of the first mask layer 311 and a top surface of the second gate 309 on the second fin 302.

Because the height difference Δh (i.e., h1-h2) between the top surface of the first fin 301 and the top surface of the second fin 302 is pre-defined to be equal to a combined thickness of a second gate 309 and a second gate dielectric layer 308 to be subsequently formed, there is no need to remove the second gate 309 in this step.

Referring to FIG. 3 of the exemplary method for forming a semiconductor device, FIGS. 16-19 depict another exemplary corresponding semiconductor device at various stages during its formation in accordance with various disclosed embodiments.

For example, Step S31 of FIG. 1 can be performed as depicted above. In Step S32 of FIG. 3 and referring to FIGS. 16-17, the first fin 301 and the second fin 302 are formed on the semiconductor substrate 300. This also includes the formation of the first mask layer 311 on the first fin 301 and formation of a second mask layer 322 on the second fin 302. The method used to form the first mask layer 311 on the first fin 301 and the second mask layer 322 on the second fin 302 includes the following.

Figure 16:
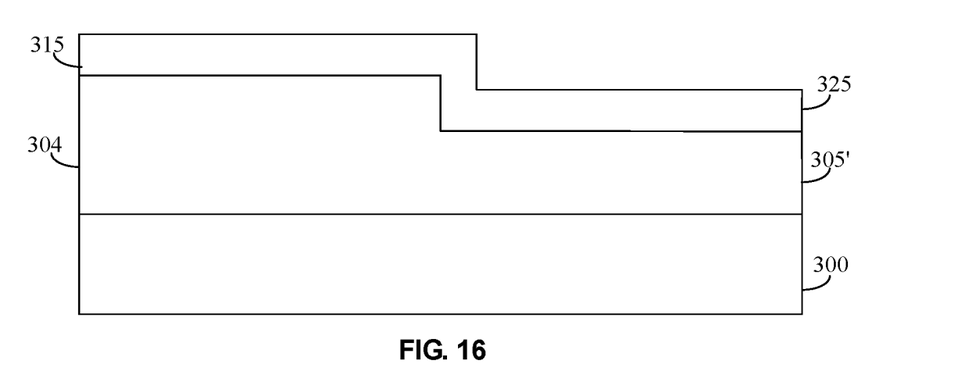
FIGS. 16-19 are cross-sectional views of another exemplary semiconductor device at various stages during its formation in accordance with various disclosed embodiments.

In FIG. 6 and FIG. 16, after a certain height of the second top silicon layer 305 is removed to have a remaining second top silicon layer 305', a mask layer is formed, by deposition, on the first top silicon layer 304 and the remaining second top silicon layer 305'. More specifically, the mask layer on the first top silicon layer 304 is referred to as a first mask layer 315, while the mask layer deposited on the remaining second top silicon layer 305' is referred to as a second mask layer 325 as shown in FIG. 6.

Figure 17:
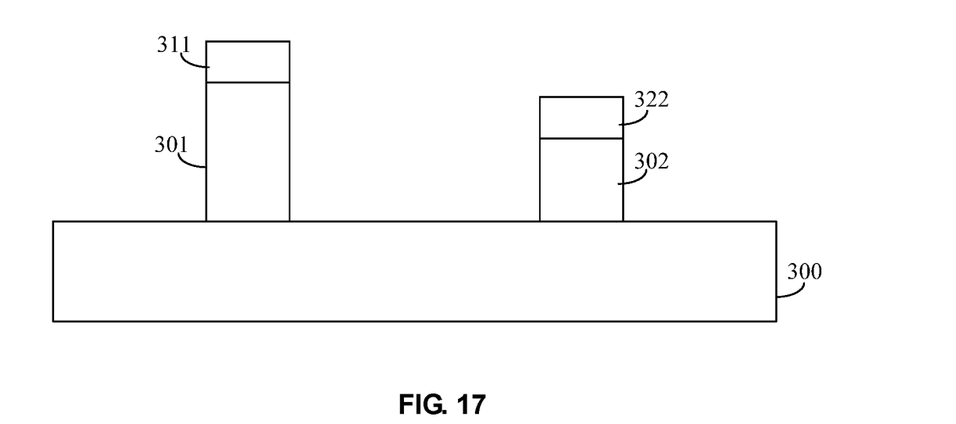

Referring to FIGS. 16-17, the first top silicon layer 304 is patterned to remove a portion of the height of the second top silicon layer 305'. The first mask layer 315 on the first top silicon layer 304 is also patterned to remove a portion of the second mask layer 325 on the second top silicon layer 305'. By this patterning and removal (e.g., etching) process, a first mask layer 311 on a first fin 301 and a second mask layer 322 on a second fin 302 can be formed as shown in FIG. 17.

Methods used to pattern the first mask layer 315, the second mask layer 325, and the first top silicon layer 304 and remove portions of the remaining second top silicon layer 305' can include the following. For example, a third mask layer (not shown) is formed on the second mask layer 325 having a top surface of the third mask layer leveled with the first mask layer 315. A patterned photoresist layer can be formed over the first mask layer 315 and the second mask layer 325 to define positions of the first fin 301 and the second fin 302 that are to be formed. The patterned photoresist layer is used as a mask to etch the first mask layer 315, the second mask layer 325, the first top silicon layer 304, the remaining second top silicon layer 305', and the third mask layer. The remaining third mask layer is a patterned third mask layer (not shown). The patterned photoresist layer is then removed, followed by the removal of the patterned third mask layer. The purpose of forming the third mask layer on the second mask layer 325 is to achieve uniform exposure of the photoresist during the process of forming the patterned photoresist layer. The developer used in the development process of the photoresist layer is also uniformly applied to ensure that the thickness of the patterned photoresist layer is the same, consistent, with density distributed evenly on the substrate 300 to achieve desired etching effect.

The thickness of the first mask layer 311 and the second mask layer 322 can be substantially the same, or in some cases, can be different. In specific applications, as long as the height difference between the top surface of the first mask layer 311 and the stop surface of the second mask layer 322 is greater than or equal to the combined thickness of the second dielectric layer and the second gate that are to be formed, the thickness of the first mask layer 311 and the second mask layer 322 can be acceptable and within the scope of the present disclosure, provided that adjustment is made to the remaining second top silicon layer 305' (e.g., and/or a removed height of the second top silicon layer 305), the thickness of the first mask layer 311, and the thickness of the second mask layer 322.

Figure 18:
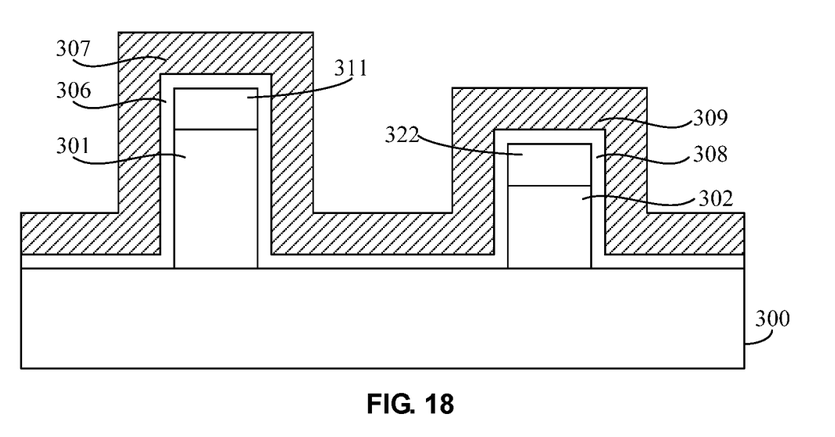

In step S33 of FIG. 3 and referring to FIG. 18, the first gate dielectric layer 306 and the first gate 307 are formed across the first mask layer 311 and the first fin 301. The second gate dielectric layer 308 and the second gate 309 are formed across the second mask layer 322 and the second fin 322. The first gate dielectric layer 306, the first gate 307, the second gate dielectric layer 308, and the second gate 309, can be formed using the methods as depicted above.

Figure 19:
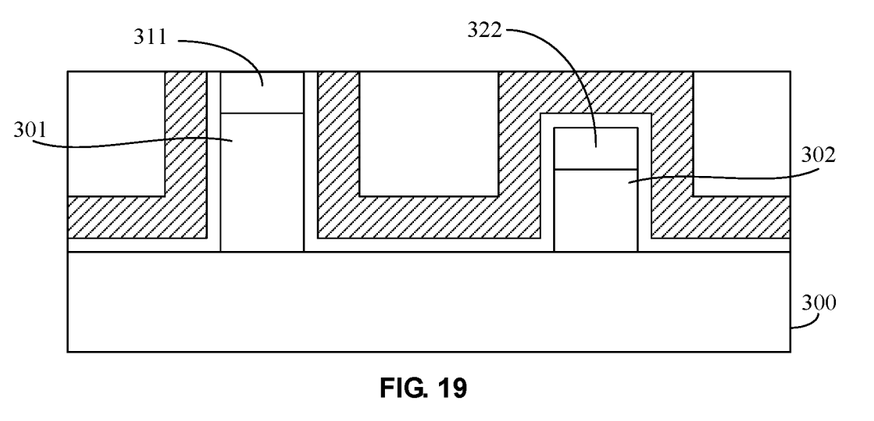

The method depicted in FIG. 3 can then proceed to perform Steps S34-S35 as depicted above. Referring to FIG. 19, as the height difference between the top surface of the first mask layer 311 and the top surface of the second mask layer 322 is pre-defined to be equal to the combined thickness of the second gate dielectric layer 308 and the second gate 309, the implementation of this Step does not need to remove the second gate 309.

As disclosed herein, referring to FIG. 10, semiconductor devices formed by the exemplary method depicted in FIG. 3 can include a first fin 301 and a second fin 302 disposed on a semiconductor substrate 300, with a top surface of the first fin 301 higher than a top surface of the second fin 302. The first gate dielectric layer 306 and the first gate 307 can be disposed on the opposite sides of the first fin 301. The second gate 309 and the second gate dielectric layer 308 can be formed across the second fin 302. The second gate 309 is formed on the second gate dielectric layer 308.

An Inter-layer dielectric layer 310 can be disposed over the semiconductor substrate 300. The first gate 307 is formed over the side of the first fin 301. The second gate 309 is formed over the side of the second fin 302. A top surface of the inter-layer dielectric layer 310, a top surface of the first fin 301, a top surface of the second gate 309 on the second fin 302 are leveled (flushed) with one another.

The formed semiconductor devices can include a 3T-FinFET including the second gate 309; and a 4T-FinFET including two first gates 307 on opposite sides of the first fin 301. More specifically, one of the two first gates 307 is a control gate and the other is a drive gate to control the transistor.

Figure 15:
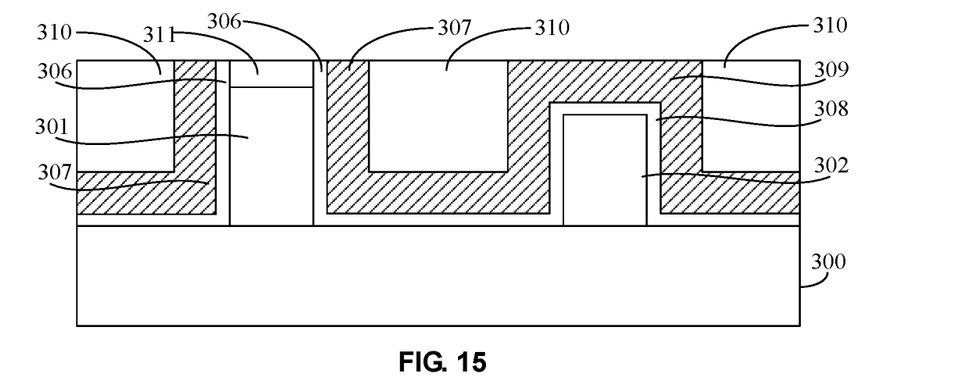

As disclosed herein, referring to FIG. 15, semiconductor devices can be formed by the exemplary method depicted in FIG. 3. Compared with the semiconductor devices shown in FIG. 10, the semiconductor devices depicted in FIG. 15 can further include a first mask layer 311 disposed on the first fin 301. The first gate dielectric layer 306 is used to cover two opposite sides of the first fin 301 and two opposite sides of the first mask layer 311. A top surface of the inter-layer dielectric layer 310 is on the same level as the top surface of the first mask layer 311 and the top surface of the second gate 309. The structure and positions of the semiconductor substrate 300, the two opposite first gates 307 and the second gate 309 can be the same for the semiconductor devices depicted in FIG. 10. The first mask layer 311 can be a hard mask layer and can be made of materials including: silicon nitride, silicon oxide, silicon nitride oxide, amorphous carbon, and/or boron nitride.

As disclosed herein, referring to FIG. 19, semiconductor devices can be formed by the exemplary method depicted in FIG. 3. Compared with the semiconductor devices shown in FIG. 10, the semiconductor devices depicted in FIG. 19 can further include a first mask layer 311 disposed on the first fin 301 and a second mask layer 322 disposed on the second fin 302. More specifically, the thickness of the first mask layer 311 equals to the thickness of the second mask layer 322, while the top surface of the inter-layer dielectric layer 310 and the top surface of the first mask layer 311 and the top surface of the second gate 309 are leveled with each other. Each of the first mask layer 311 and the second mask layer 322 can be a hard mask layer and can be made of a material including silicon nitride, silicon oxide, silicon nitride oxide, amorphous carbon, and/or boron nitride.

Figure 20:
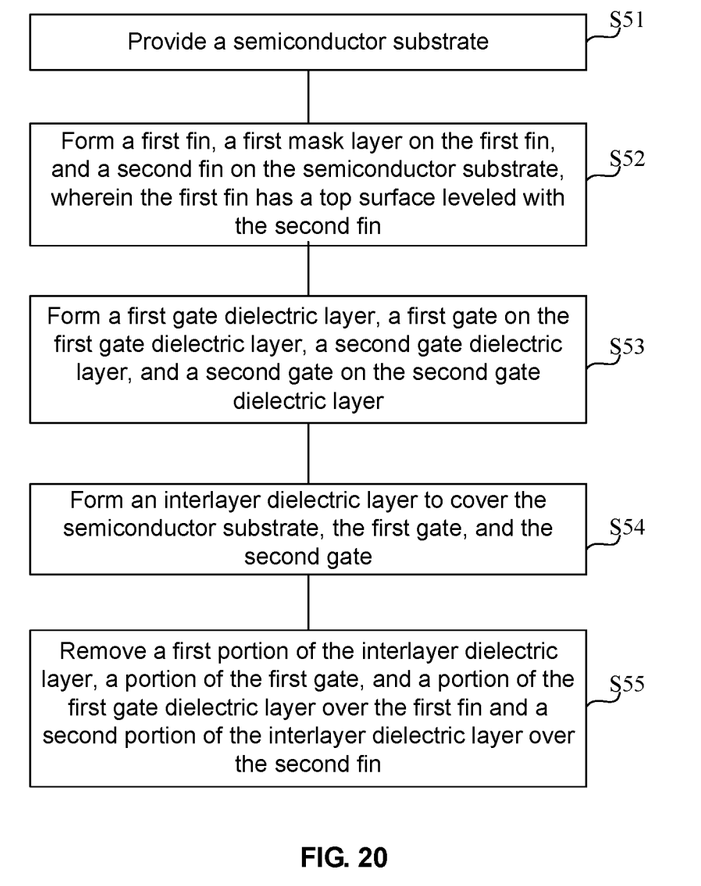
FIG. 20 depicts another exemplary method for forming a semiconductor device in accordance with various disclosed embodiments.

FIG. 20 depicts another exemplary method for forming a semiconductor device, and FIGS. 21-25 depict an exemplary corresponding semiconductor device at various stages during its formation in accordance with various disclosed embodiments.

Figure 21:
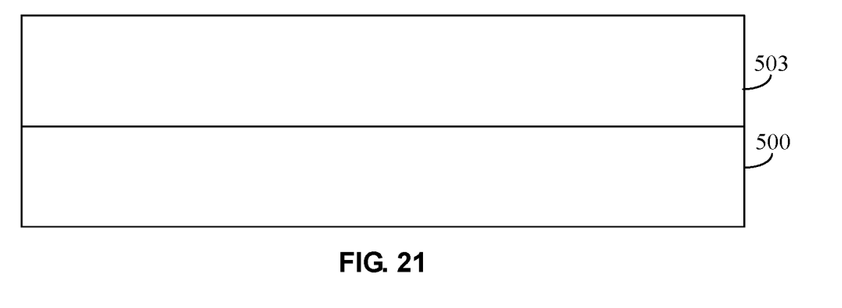
FIGS. 21-26 are cross-sectional views of another exemplary semiconductor device at various stages during its formation in accordance with various disclosed embodiments.

In step S51 of FIG. 20 and referring to FIG. 21, a semiconductor substrate 500 is provided. Subsequently, a 3T-FinFET and a 4T-FinFET can be simultaneously formed on the semiconductor substrate 500.

The semiconductor substrate 500 can include an SOI substrate having an insulating layer sandwiched between a top silicon layer and a bottom silicon layer. As shown in FIG. 21, a top silicon layer 503 is used to form fin(s) of semiconductor devices including transistors. The insulating layer (not shown) can insulate the semiconductor devices.

Figure 22:
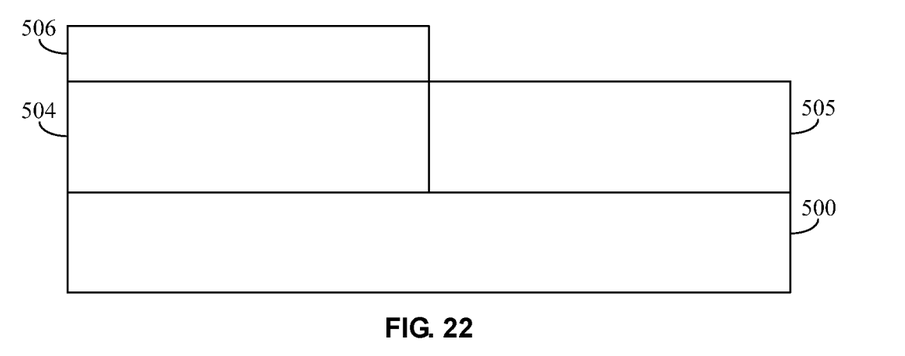
Figure 23:
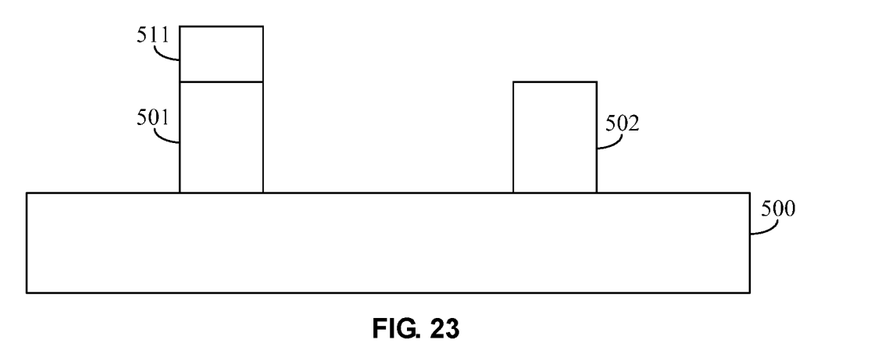

In Step S52 of FIG. 20 and referring to FIGS. 22-23, a first fin 501 is formed on the semiconductor substrate 500. A first mask layer 511 is formed on the first fin 502 and a second fin 502 is also formed. More specifically, the top surface of the first fin 501 is on a same height level as the top surface of the second fin 502. A thickness (or height) of the first mask layer 511 is greater than or equal to a combined thickness of a second gate dielectric layer and a second gate that are to be formed. This is to ensure that the second gate is not removed when removing a first gate dielectric layer and a first gate that are subsequently formed on the first fin 501.

The first fin 501, the first mask layer 511 on the first fin 501, and the second fin 502 can be formed as following. Referring to FIG. 22, the top silicon layer 503 is divided into two parts including a first top silicon layer 504 and a second top silicon layer 505 according to the positions of a first fin and a second fin that are to be formed. The first top silicon layer 504 can be used to form the first fin while the second top silicon layer 505 can be used to form the second fin. As shown in FIG. 22, a first mask layer 506 is formed on the first top silicon layer 504 to cover the first top silicon layer 504. To form the first mask layer 506, a mask layer can be formed to cover the first top silicon layer 504 and the second top silicon layer 505. The mask layer can be patterned by removing a portion from the second top silicon layer 505 to form the first mask layer 506 covering the first top silicon layer 504. The first mask layer 506 can be formed to ensure that the thickness thereof is greater than or equal to a combined thickness of the second gate dielectric layer and the second gate that are subsequently formed.

In FIGS. 22-23, the first mask layer 506, the first top silicon layer 504, and the second top silicon layer 505 are then patterned to form the first fin 501, the first mask layer 511 on the first fin 501, and the second fin 502 on the substrate 500. For example, a photoresist layer can be patterned on the first mask layer 506 and the second top silicon layer 505. The patterned photoresist layer can be used as a mask layer to etch the first mask layer 506, the first top silicon layer 504 and the second top silicon layer 505 and to expose the semiconductor substrate 500. The patterned photoresist layer can then be removed.

The first mask layer 511 can be a hard mask layer and be made of a material including silicon nitride, silicon oxide, silicon nitride oxide, amorphous carbon, and/or boron nitride.

Figure 24:
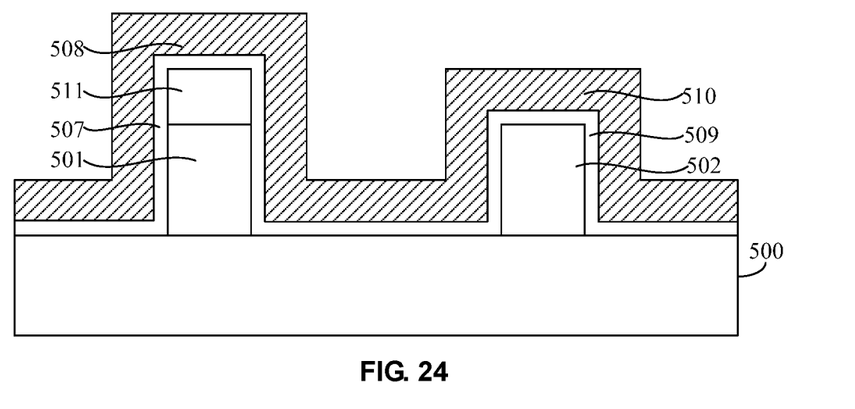

In Step S53 of FIG. 20 and referring to FIG. 24, a first gate dielectric layer 507, a first gate 508, a second gate dielectric layer 509, and a second gate 510 are formed on the semiconductor substrate 500. The first gate dielectric layer 507 and the first gate 508 can be formed across the first mask layer 511 and the first fin 501. The second gate dielectric layer 509 and the second gate 510 can be formed across the second fin 502. The formation of the first gate dielectric layer 507, the first gate 508, the second gate dielectric layer 509, and the second gate 510 can be the same as depicted above, e.g., as shown in FIGS. 13-14.

Figure 25:
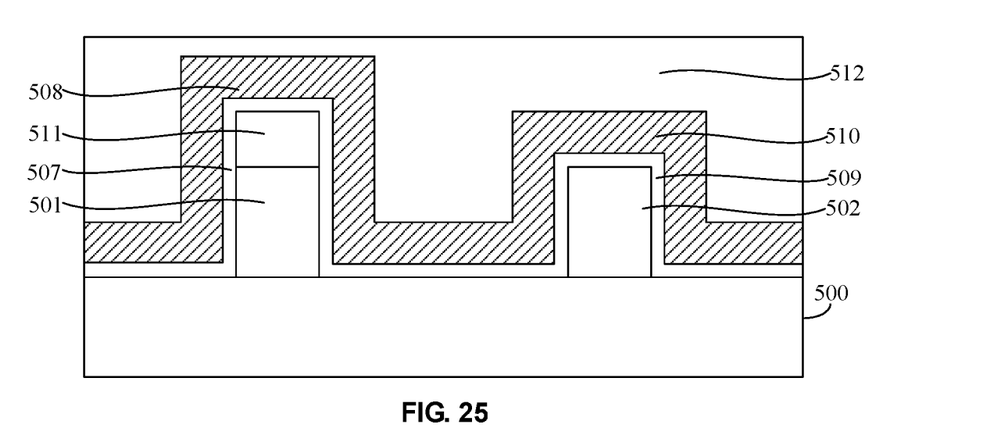

In Step S54 of FIG. 20 and referring to FIG. 25, an inter-layer dielectric layer 512 is formed to cover the entire surface of the semiconductor structure in FIG. 24, e.g., including the first gate 508 and the second gate 510. In various embodiments, source and drain (not shown) can be formed in the semiconductor substrate 500 on the sides of the first gate 508 and the second gate 510.

Figure 26:
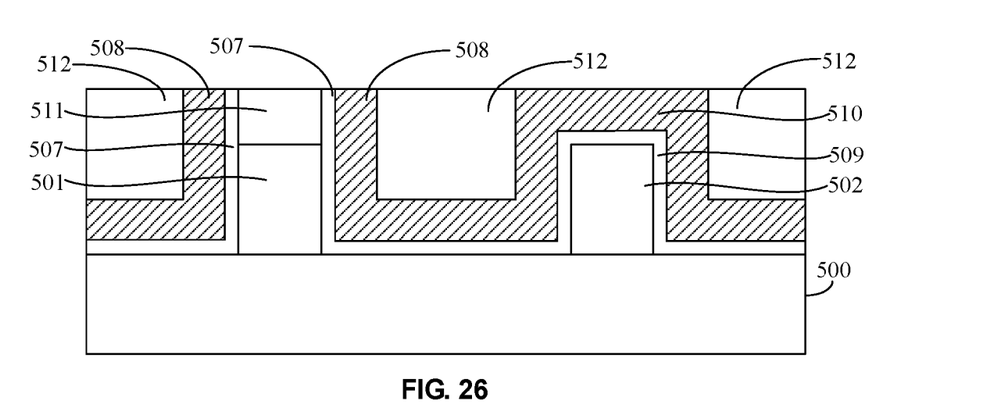

In Step S55 of FIG. 20 and referring to FIG. 26, the inter-layer dielectric layer 512 on the first fin 501, the first gate dielectric layer 507 on the first fin 501, the first gate 508 on the first fin 501, and the inter-layer dielectric layer 512 on the second gate 510 are removed. That is, portions of each of the inter-layer dielectric layer, the first gate dielectric layer, and the first gate that are higher than the first mask layer 511 can be removed, while the second gate 510 is maintained. The thickness of the first mask layer 511 can be pre-defined to be equal to the combined thickness of the second gate dielectric layer 509 and the second gate 510 such that, after removal, the remaining first gate dielectric layer and the remaining first gate that are on the opposite sides of the first mask layer 511 and the first fin 501, and the remaining inter-layer dielectric layer 512 can be leveled (flushed) with the first mask layer 511, and the second gate 510 on the second fin 502, as shown in FIG. 26.

An exemplary chemical mechanical polishing (CMP) process or an etching back process can be used to remove portions of the inter-layer dielectric layer 512, the first gate dielectric layer 507, and the first gate 508, from the first fin 501, and to remove portion(s) of the inter-layer dielectric layer 512 from the second gate 510 to form the structure shown in FIG. 26. Such removal process can be completed by exposing the top surface of the first mask layer 511 and the top surface of the second gate 510. Exact portion(s) of the first gate dielectric layer 507 and the first gate 508 can be removed, while leaving the second gate 510 intact (without any etching or removal of the second gate 510).

In this manner, a 3T-FinFET including the second gate 510 and a 4T-FinFET including two opposing first gates 508 are simultaneously formed on a same wafer. One of the two first gates 510 is a drive gate and the other of the two first gates 510 is a control gate to control a threshold voltage of the transistor to realize the purpose of turning on or off the transistor. In addition, power consumption of the transistor in a standby mode can be reduced by increasing in the threshold voltage.

Various disclosed embodiments provide a simplified manufacturing process. By pre-defining a height difference between the first and second fins when forming the first and second fins, the second gate on the second fin can be formed without further process including a removing step, when the first gate dielectric layer and the first gate on the first fin are removed subsequently. This simplifies manufacturing procedures and improves efficiency. Moreover, various disclosed embodiments can be compatible with existing photoresist and etching processes and is simple to operate and easy to implement. Productivity can be enhanced and production cost can be reduced.

FIG. 20 depicts another exemplary method for forming a semiconductor device, and FIGS. 27-31 depict another exemplary corresponding semiconductor device at various stages during its formation in accordance with various disclosed embodiments.

For example, Step S51 of FIG. 20 can be performed as depicted above. In Step S52 of FIG. 20 and referring to FIG. 29, a second mask layer 522 is formed on the second gate 502 in addition to forming a first mask layer 511 on the first gate 501 (e.g., as depicted above in FIG. 23). More specifically, a top surface the first mask layer 511 is higher than a top surface of the second mask layer 522 on the substrate 500. The height difference between the top surfaces of the first mask layer 511 and the second mask layer 522 is greater than or equal to a combined thickness of a second gate dielectric layer and a second gate that are to be formed.

Various methods can be used to form the second mask layer 522 on the second fin 502. For example: in FIG. 22 and FIG. 27, a first mask layer 506 is formed on a first top silicon layer 504 and the second top silicon layer 505 to cover the entire surface of a top silicon layer (e.g., top silicon layer 503 in FIG. 21). In one example, the first mask layer 506 in FIG. 27 is thicker than the first mask layer 506 as depicted in FIG. 22.

Figure 27:
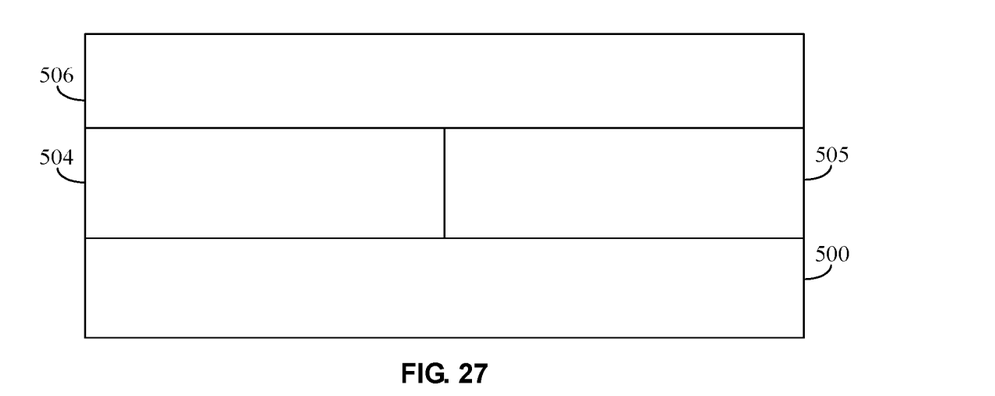
FIGS. 27-31 are cross-sectional views of another exemplary semiconductor device at various stages during its formation in accordance with various disclosed embodiments.
Figure 28:
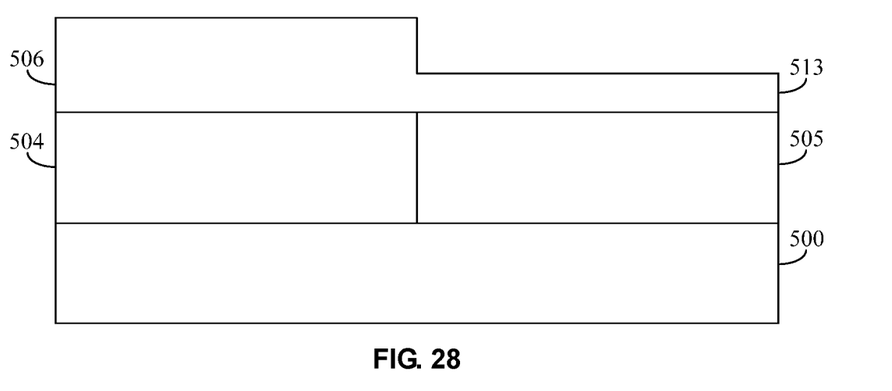

Referring to FIGS. 27-28, a portion of the first mask layer 506 on the second top silicon layer 505 is removed to have the remaining first mask layer on the second top silicon layer 505 as the second mask layer 513. The portion of the first mask layer 506 can be removed by forming a patterned photoresist silicon layer, e.g., on the top silicon layer 503 (referring to FIG. 21) to define the position of the second top silicon layer 505. The patterned photoresist layer is used as a mask to etch and remove the portion of the first mask layer on the second top silicon layer 505. The patterned photoresist layer is then removed.

Figure 29:
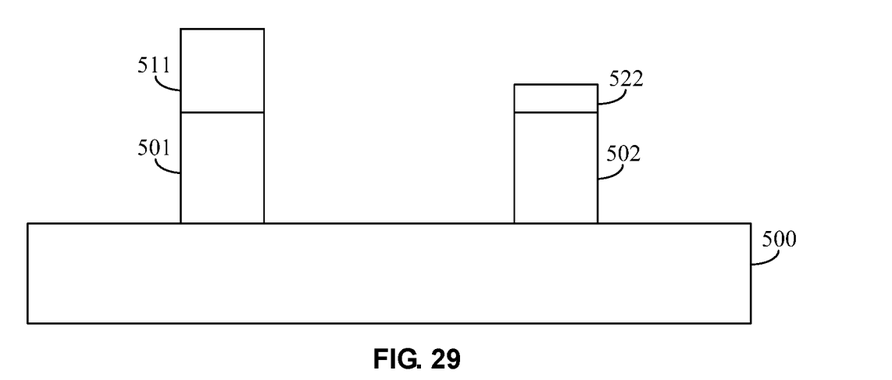

Referring to FIGS. 28-29, the first mask layer 506, the first top silicon layer 504, and the second top silicon layer 505 can be patterned to form the first mask layer 511 on the first fin 501. The second mask layer 513 can be patterned to form the second mask layer 511 on the second fin 501. For example, the second mask layer 513 can be patterned by forming a third mask layer (not shown) on the second mask layer 513, with the top surface of the third mask layer and the top surface of the first mask layer 506 on a same height level. Patterned photoresist layer is formed on the first mask layer 506 and the third mask layer (not shown). The locations of the first and second fins that are to be formed are defined. The patterned photoresist layer is used as a mask to etch the first mask layer 506, the second mask layer 513, the third mask layer, the first top silicon layer 504, and the second top silicon layer 505. The patterned photoresist layer is then removed. And the third mask layer after etching is also removed. It is important to note here that the purpose of the formation of the third mask layer to be leveled with the first mask layer 506 is that, when patterning the photoresist layer, the photoresist is exposed uniformly and the developer is used uniformly and evenly in the development process. This results in the uniform thickness and density of patterned photoresist layer that is formed to achieve better etching effect.

Figure 30:
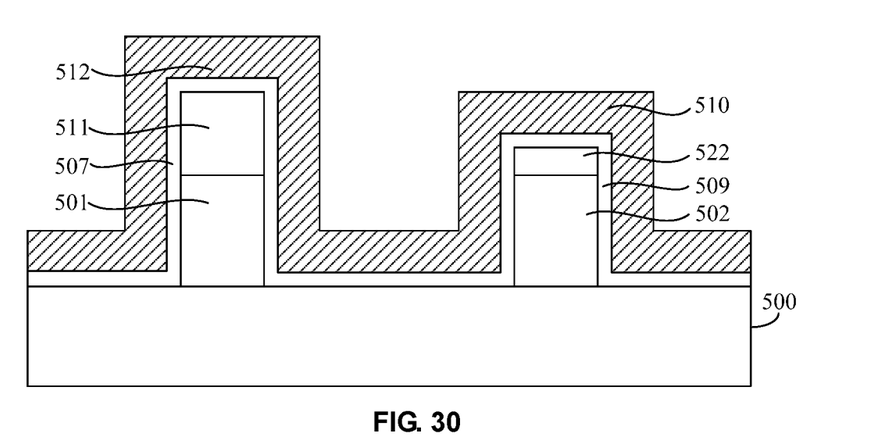

In Step S53 of FIG. 20 and referring to FIG. 30, a first gate dielectric layer 507 and a first gate 508 are formed across the first mask layer 511 and the first fin 501. The second gate dielectric layer 509 and the second gate 510 are formed across the second mask layer 522 and the second fin 502. Methods used to form the first gate dielectric layer, the first gate, the second gate dielectric layer, and the second gate are the same as outlined in Step S35 of FIG. 20 as depicted above.

Figure 31:
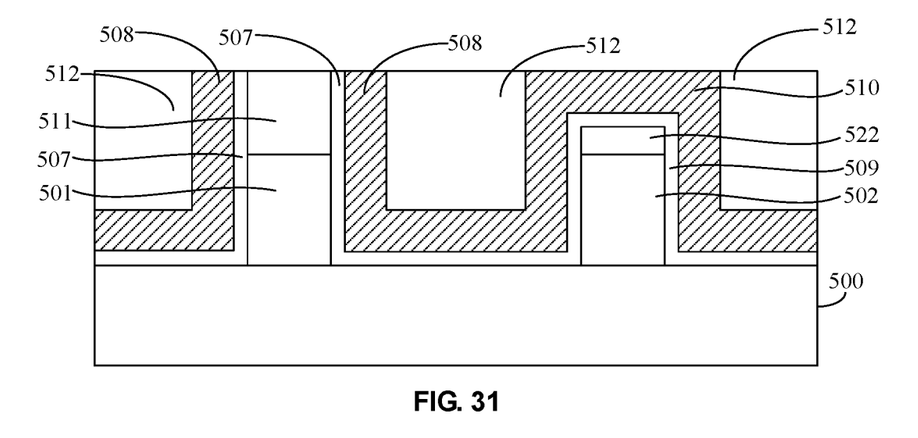

Steps S54-S55 of FIG. 20 can be performed as depicted above. Referring to FIG. 31, as the height difference between the top surface of the first mask layer 511 and the top surface of the second mask layer 522 is pre-defined to be equal to the combined thickness of the second gate dielectric layer 509 and the second gate 510, the step of processing (e.g., removing) a portion of the second gate 510 can be omitted.

Referring to FIG. 26, exemplary semiconductor devices provided herein include a first fin 501 disposed on the semiconductor substrate 500, a first mask layer 511 disposed on the first fin 501, and a second fin 502 disposed on the semiconductor substrate 500. More specifically, the top surfaces of the first fin 501 and the second fin 502 have the same height from the semiconductor substrate 500.

The first gate dielectric layer 507 is disposed on the opposite sides of the first mask layer 511 and the first fin 501. The first gate 508 is disposed on the first gate dielectric layer 507 on the opposite sides of the first mask layer 511. The second gate dielectric layer 509 is formed across the second fin 502. The second gate 510 is disposed on the second gate dielectric layer 509.

An inter-layer dielectric layer 512 is disposed over the semiconductor substrate 500. A top surface of portions of the first gate disposed over the sides of the first fin 501 and over the sides of the first mask layer 511 can be leveled (or flushed) with a top surface of the inter-layer dielectric layer 512, a top surface of first mask layer 511, and a top surface of the second gate on the second fin 502. The first mask layer 511 can be a hard mask layer and made of a material including silicon nitride, silicon oxide, silicon nitride oxide, amorphous carbon, and/or boron nitride.

Referring to FIG. 31, exemplary semiconductor devices provided herein further include a second mask layer 522 disposed on the second fin 502 compared with the semiconductor devices shown in FIG. 26. The second gate dielectric layer 509 and the second gate 510 can be formed across the second fin 502 and the second mask layer 522. The first mask layer 511 and the second mask layer 522 can be hard mask layers and can be made of a material including silicon nitride, silicon oxide, silicon nitride oxide, amorphous carbon, and/or boron nitride.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming a semiconductor device, comprising:
provi­ding a semiconductor substrate;
forming a first fin, a first mask layer on the first fin, and a second fin on the semiconductor substrate, wherein the first fin has a top surface leveled with the second fin;
forming a first gate dielectric layer, a first gate on the first gate dielectric layer, a second gate dielectric layer, and a second gate on the second gate dielectric layer, wherein the first gate and the first gate dielectric layer are formed across the first mask layer and the first fin, and the second gate and the second gate dielectric layer are formed across the second fin;
forming an interlayer dielectric layer to cover the semiconductor substrate, the first gate, and the second gate; and
removing a first portion of the interlayer dielectric layer, a portion of the first gate, and a portion of the first gate dielectric layer over the first fin and a second portion of the interlayer dielectric layer over the second fin, to expose the second gate over the second fin, wherein the second gate remains intact while removing;
wherein the semiconductor substrate includes an SOI substrate including a top silicon layer and wherein forming the first fin, the first mask layer, and the second fin includes:
dividing the top silicon layer into a first top silicon layer for forming the first fin and a second top silicon layer for forming the second fin, according to a pre-defined position for forming each of the first fin and the second fin,
forming a first mask layer portion on the first top silicon layer, and patterning the first mask layer portion, the first top silicon layer and the second top silicon layer to form the first fin, the first mask layer on the first fin, and the second fin.

2. The method of claim 1, further including forming a second mask layer on the second fin, and wherein the first mask layer has a height greater than the second mask layer, and wherein forming the second mask layer includes:
forming a first mask layer portion on the first top silicon layer and the second top silicon layer,
removing a height portion of the first mask layer portion on the second top silicon layer to form a second mask layer portion on the second top silicon layer, and
while patterning the first mask layer portion, the first top silicon layer and the second top silicon layer, patterning the second mask layer portion to form the second mask layer on the second fin.

3. The method of claim 2, wherein patterning the first mask layer portion, the second mask layer portion, the first top silicon layer and the second top silicon layer includes:
forming a third mask layer on the second mask layer portion such that a top surface of the third mask layer is leveled with a top surface of the first mask layer portion,
forming a patterned photoresist layer on the first mask layer portion and on the third mask layer to define a position for forming each of the first fin and the second fin,
using the patterned photoresist layer as an etch mask to etch the first mask layer portion, the second mask layer portion, the first top silicon layer, the second top silicon layer, and the third mask layer,
removing the patterned photoresist layer, and
removing a remaining portion of the third mask layer after etching.

4. The method of claim 1, wherein the removing step include a chemical mechanical polishing process or an etching back process.

5. A semiconductor device
formed by the method of claim 1, wherein the interlayer dielectric layer has a top surface leveled with the top surface of the first mask layer and a top surface of the second gate.

6. The device of claim 5, further includes a second mask layer disposed on the second fin, the first mask layer has a height greater than the second mask layer, and the second gate dielectric layer and the second gate are disposed across the second fin.

* * * * *